US012640743B1

(12) United States Patent
Summers et al.

(10) Patent No.: US 12,640,743 B1
(45) Date of Patent: May 26, 2026

(54) HANDLING PHASE INTERPOLATOR INTEGRAL NON-LINEARITY ERRORS BASED ON PHASE ERROR MEASUREMENTS

(71) Applicant: Cadence Design Systems, Inc., San Jose, CA (US)

(72) Inventors: Mark A. Summers, Cary, NC (US); Kelvin E. McCollough, Garner, NC (US); Douglas Scott Shelton, Kingsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 65 days.

(21) Appl. No.: 18/965,835

(22) Filed: Dec. 2, 2024

(51) Int. Cl.
  *H03L 7/093* (2006.01)
  *H03L 7/087* (2006.01)
(52) U.S. Cl.
  CPC .............. *H03L 7/093* (2013.01); *H03L 7/087* (2013.01)
(58) Field of Classification Search
  CPC ................................ H03L 7/093; H03L 7/087
  See application file for complete search history.

(56) References Cited

U.S. PATENT DOCUMENTS 11,245,554 B1* 2/2022 Zhang ................... H03L 7/0807
2017/0194976 A1* 7/2017 Nonis ..................... H04L 7/033

* cited by examiner

*Primary Examiner* — Metasebia T Retebo
(74) *Attorney, Agent, or Firm* — Schwegman Lundberg & Woessner, P.A.

(57) ABSTRACT

Various example embodiments provide for handling phase interpolator (PI) integral non-linearity (INL) errors based on phase error measurements, which can be used in conjunction with clock data recovery (CDR) within a circuit, such as a data serializer/deserializer (SerDes) circuit. In particular, various example embodiments provide a PI system configured to measure and handle (e.g., reduce or correct) PI integral INL errors, where the PI system comprises a PI, a phase detector, a first-order path, a second-order loop, a phase integrator, a measurement component, and a look-up-table (LUT) component. For various example embodiments, the measurement component is configured to receive phase error information for an input data signal from the phase detector, receive frequency offset information from the second-order loop, receive phase position data for the input signal to the PI, and adjust mappings of one or more phase positions to the PI to reduce or correct non-linearity in the PI.

20 Claims, 9 Drawing Sheets

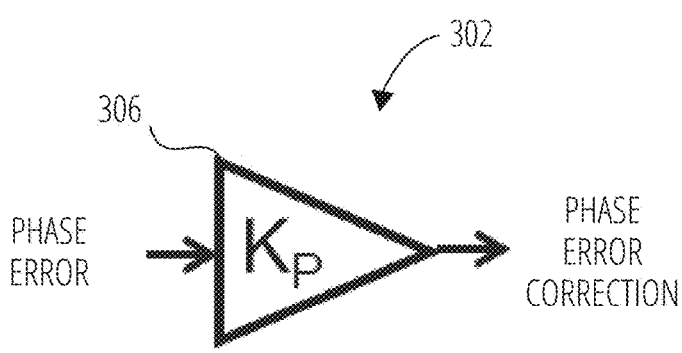
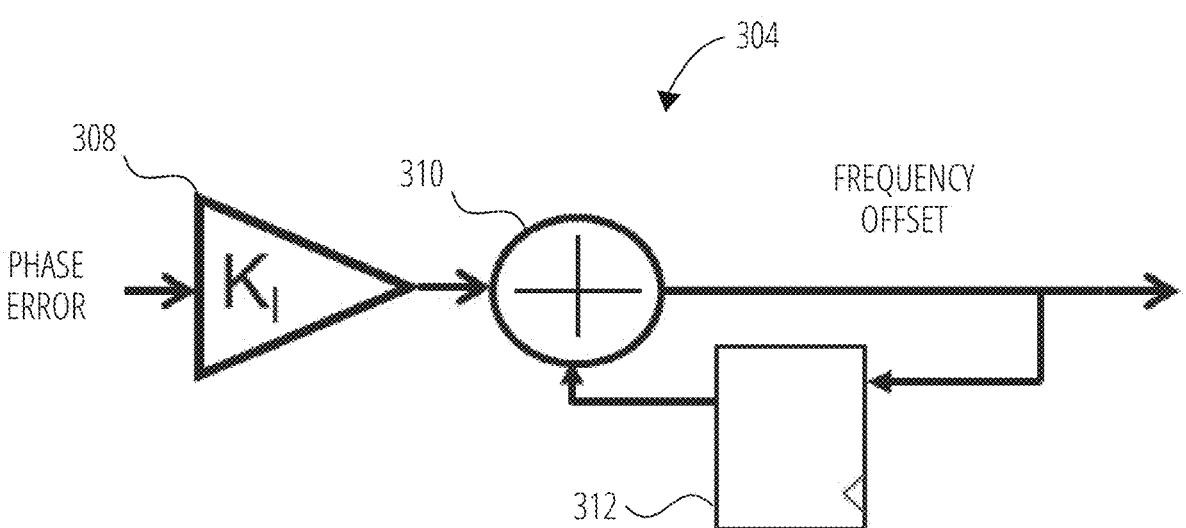
FIG. 3

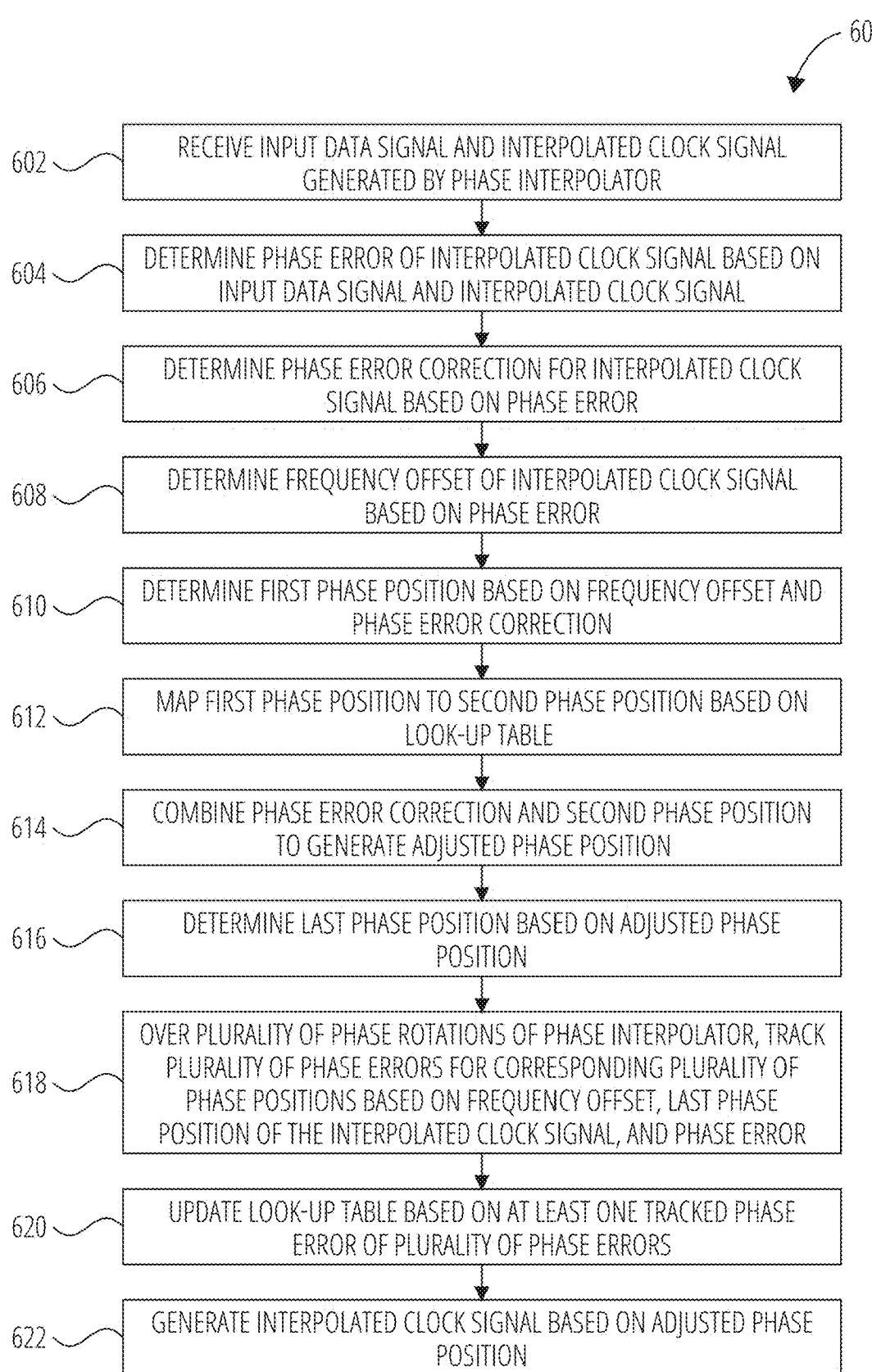

600

602 — RECEIVE INPUT DATA SIGNAL AND INTERPOLATED CLOCK SIGNAL GENERATED BY PHASE INTERPOLATOR

604 — DETERMINE PHASE ERROR OF INTERPOLATED CLOCK SIGNAL BASED ON INPUT DATA SIGNAL AND INTERPOLATED CLOCK SIGNAL

606 — DETERMINE PHASE ERROR CORRECTION FOR INTERPOLATED CLOCK SIGNAL BASED ON PHASE ERROR

608 — DETERMINE FREQUENCY OFFSET OF INTERPOLATED CLOCK SIGNAL BASED ON PHASE ERROR

610 — DETERMINE FIRST PHASE POSITION BASED ON FREQUENCY OFFSET AND PHASE ERROR CORRECTION

612 — MAP FIRST PHASE POSITION TO SECOND PHASE POSITION BASED ON LOOK-UP TABLE

614 — COMBINE PHASE ERROR CORRECTION AND SECOND PHASE POSITION TO GENERATE ADJUSTED PHASE POSITION

616 — DETERMINE LAST PHASE POSITION BASED ON ADJUSTED PHASE POSITION

618 — OVER PLURALITY OF PHASE ROTATIONS OF PHASE INTERPOLATOR, TRACK PLURALITY OF PHASE ERRORS FOR CORRESPONDING PLURALITY OF PHASE POSITIONS BASED ON FREQUENCY OFFSET, LAST PHASE POSITION OF THE INTERPOLATED CLOCK SIGNAL, AND PHASE ERROR

620 — UPDATE LOOK-UP TABLE BASED ON AT LEAST ONE TRACKED PHASE ERROR OF PLURALITY OF PHASE ERRORS

622 — GENERATE INTERPOLATED CLOCK SIGNAL BASED ON ADJUSTED PHASE POSITION

FIG. 6

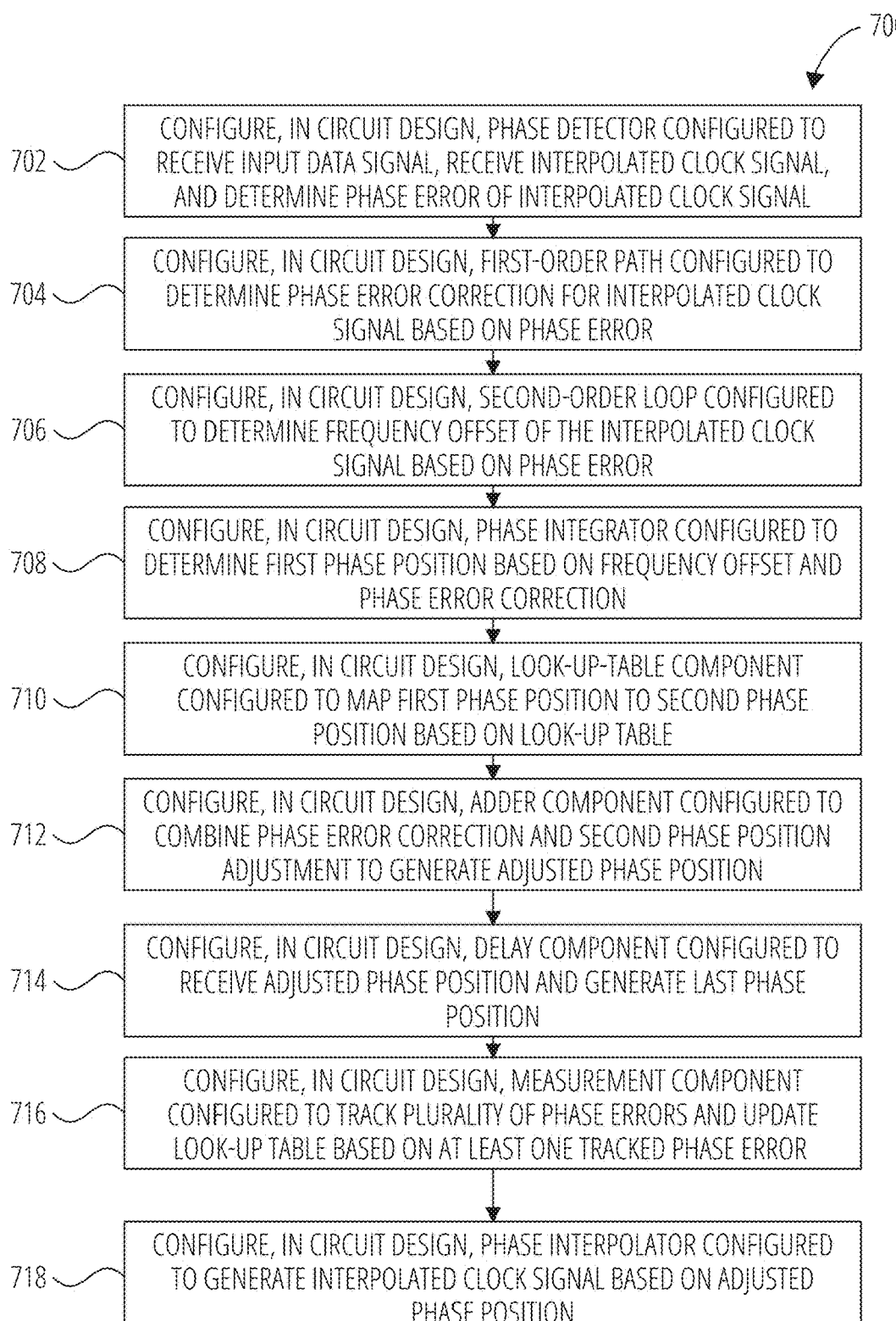

702 — CONFIGURE, IN CIRCUIT DESIGN, PHASE DETECTOR CONFIGURED TO RECEIVE INPUT DATA SIGNAL, RECEIVE INTERPOLATED CLOCK SIGNAL, AND DETERMINE PHASE ERROR OF INTERPOLATED CLOCK SIGNAL

704 — CONFIGURE, IN CIRCUIT DESIGN, FIRST-ORDER PATH CONFIGURED TO DETERMINE PHASE ERROR CORRECTION FOR INTERPOLATED CLOCK SIGNAL BASED ON PHASE ERROR

706 — CONFIGURE, IN CIRCUIT DESIGN, SECOND-ORDER LOOP CONFIGURED TO DETERMINE FREQUENCY OFFSET OF THE INTERPOLATED CLOCK SIGNAL BASED ON PHASE ERROR

708 — CONFIGURE, IN CIRCUIT DESIGN, PHASE INTEGRATOR CONFIGURED TO DETERMINE FIRST PHASE POSITION BASED ON FREQUENCY OFFSET AND PHASE ERROR CORRECTION

710 — CONFIGURE, IN CIRCUIT DESIGN, LOOK-UP-TABLE COMPONENT CONFIGURED TO MAP FIRST PHASE POSITION TO SECOND PHASE POSITION BASED ON LOOK-UP TABLE

712 — CONFIGURE, IN CIRCUIT DESIGN, ADDER COMPONENT CONFIGURED TO COMBINE PHASE ERROR CORRECTION AND SECOND PHASE POSITION ADJUSTMENT TO GENERATE ADJUSTED PHASE POSITION

714 — CONFIGURE, IN CIRCUIT DESIGN, DELAY COMPONENT CONFIGURED TO RECEIVE ADJUSTED PHASE POSITION AND GENERATE LAST PHASE POSITION

716 — CONFIGURE, IN CIRCUIT DESIGN, MEASUREMENT COMPONENT CONFIGURED TO TRACK PLURALITY OF PHASE ERRORS AND UPDATE LOOK-UP TABLE BASED ON AT LEAST ONE TRACKED PHASE ERROR

718 — CONFIGURE, IN CIRCUIT DESIGN, PHASE INTERPOLATOR CONFIGURED TO GENERATE INTERPOLATED CLOCK SIGNAL BASED ON ADJUSTED PHASE POSITION

FIG. 7

HANDLING PHASE INTERPOLATOR INTEGRAL NON-LINEARITY ERRORS BASED ON PHASE ERROR MEASUREMENTS

TECHNICAL FIELD

Example embodiments described herein relate to circuit designs and, more particularly, to systems, methods, devices, and instructions for handling phase interpolator (PI) integral non-linearity (INL) errors based on phase error measurements, which can be used in conjunction with clock data recovery (CDR) within a circuit, such as a data serializer/deserializer (SerDes) circuit.

BACKGROUND

Circuits that include serial link data interfaces commonly employ clock and data recovery (CDR) systems with phase interpolators (PIs) to sample incoming data streams. These CDR systems usually track frequency offsets and maintain optimal sampling positions, particularly in applications using Spread Spectrum Clocking (SSC) for Electromagnetic interference (EMI) reduction. In a typical implementation, a clock and data recovery system comprises components such as a continuous-time linear equalizer (CTLE), an analog-to-digital converter (ADC), a feed-forward equalizer (FFE), and a PI controlled by CDR logic (e.g., microcontroller). The PI can be used to generate a clock signal that is interpolated in phase steps (e.g., multiple evenly spaced phase steps) across multiple phases, which can facilitate adjusting and finding a clock signal with an ideal sampling point to sample an input data signal (e.g., PI phase moving to ensure sampling in the center of the eye). PIs typically operate with multiple clock phases (e.g., I (0°), Q (90°), IB (180°), and QB (270°) phases) and interpolate between these phases to generate precise sampling positions.

BRIEF DESCRIPTION OF THE DRAWINGS

Various appended drawings merely illustrate some example embodiments of the present disclosure and should not be considered as limiting its scope. In the drawings, which are not necessarily drawn to scale, like numerals may describe similar components in different views. To easily identify the discussion of any particular element or act, the most significant digit or digits in a reference number refer to the figure number in which that element is first introduced.

FIG. 3 presents schematics for an example first-order path and an example second-order loop that are part of a PI system, according to some example embodiments.

FIG. 6 is a flowchart illustrating an example method for handling phase interpolator INL errors based on phase error measurements, according to some example embodiments.

FIG. 7 is a flowchart illustrating an example method for generating a circuit design including a phase interpolator system with measurement-based INL error handling, in accordance with some embodiments.

DETAILED DESCRIPTION

Figure 1:
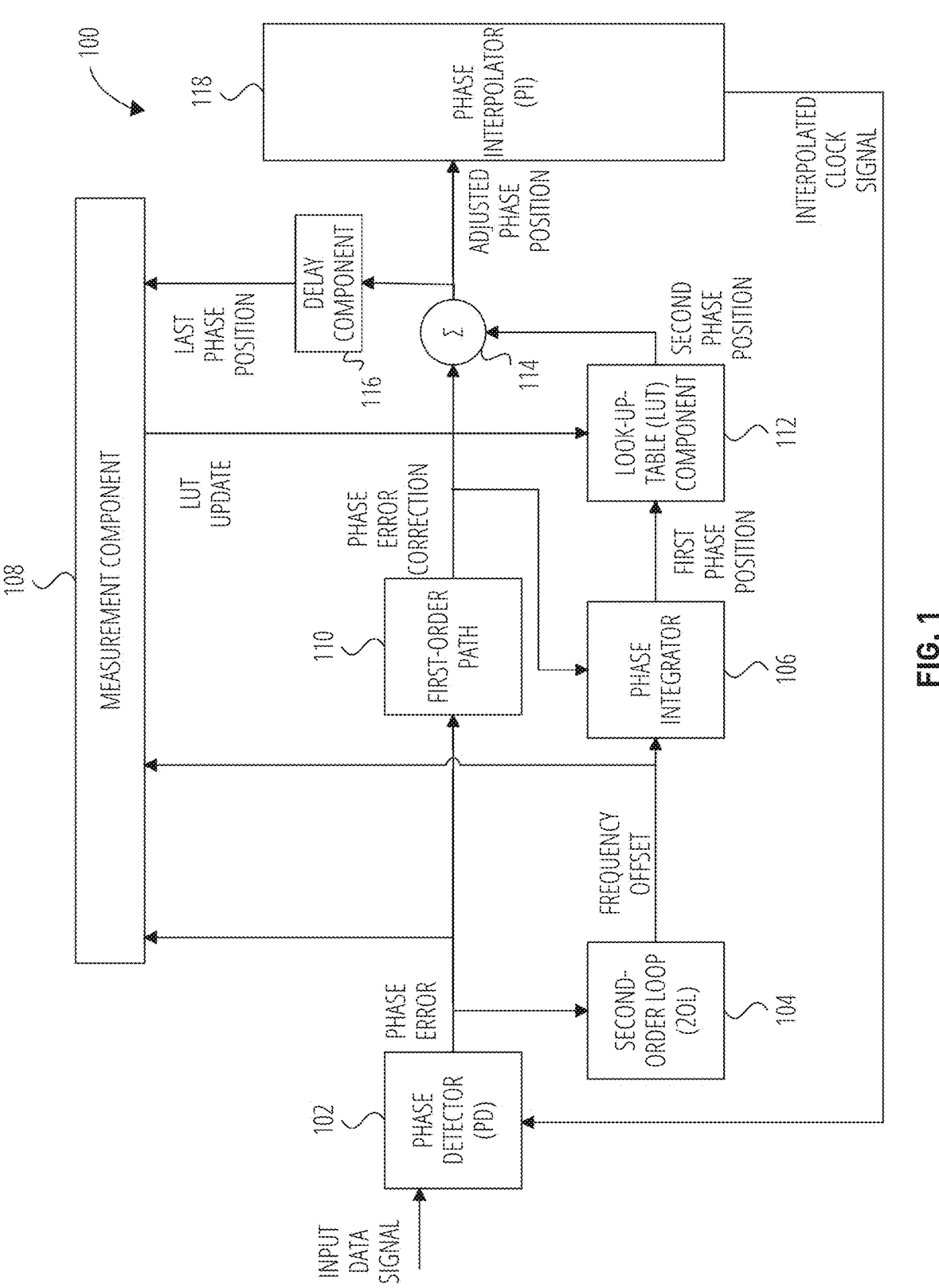
FIG. 1 is a schematic illustrating an example phase interpolator (PI) system with measurement-based integral non-linearity (INL) error handling, according to some example embodiments.

As noted, PIs typically operate with multiple clock phases (e.g., 0°, 90°, 180°, 270°) and interpolate between these phases to generate precise sampling positions. In ideal systems that include a PI, phases generated by the PI would be perfectly spaced and aligned. Specifically, in ideal systems, each phase step is equal, and the phase would shift linearly (e.g., as illustrated by a solid line 502 in graph 500 of FIG. 5). However, in actual (e.g., real-world) systems that include a PI without handling described herein, the phase tends to deviate from the ideal as the PI rotates around the full cycle (e.g., as illustrated by a dashed line 504 in graph 500 of FIG. 5) due to various non-idealities and errors. Example sources of non-linearity in PI systems include, without limitation, IQ skew, inherent non-linear mixing behavior in the PI, and digital-to-analog converter (DAC) current mismatch. These (and other) non-idealities can manifest as integral non-linearity (INL) errors in the PI output.

When tracking frequency offsets, these INL errors can accumulate and degrade system performance. For example, as a PI rotates, the phase error acts like sinusoidal jitter applied to the input data and, for some frequency offset values, a CDR can amplify this phase error. The challenge of INL errors becomes particularly significant in PI systems that support spread spectrum clocking (SSC), which requires the PI to rotate quickly to track frequency offsets. While PI systems with very slow phase rotation of the PI (or PI rotation) can partially compensate for INL error through CDR loop correction (CDR can adjust the PI control code to correct for INL error, thereby leaving only differential non-linearity (DNL) error visible in phase errors), this compensation by the CDR loop becomes ineffective when the PI rotates at higher speeds (e.g., CDR loop correction of INL error is not practical to implement in a silicon solution as it requires high levels of computation and long periods of time to rotate through all the codes). Additionally, while other conventional approaches to address non-linearities include analog suppression loops, such solutions typically require additional hardware in the main clock path, which can increase jitter. As yet another conventional approach, systems that use PIs can simply accept INL error as part of their error budget rather than attempting to correct them.

The effects of these non-idealities manifest as deviations from ideal linear phase progression, potentially causing sampling errors that can degrade system performance. When the PI rotates to track frequency offsets (e.g., frequency offset values), the phase error acts similar to sinusoidal jitter applied to the input data, and at certain frequency offset values, the CDR may amplify this phase error in a manner similar to sinusoidal jitter amplification.

Various example embodiments address deficiencies and drawbacks of conventional approaches for handling INL errors with respect to a system that includes a PI. In particular, various example embodiments provide for handling (e.g., correcting or compensating for) integral non-linearity (INL) errors for a phase interpolator (PI) based on phase error measurements. According to various example embodiments, a PI system configured to measure and handle (e.g., reduce or correct) PI integral INL errors, where the PI system comprises a PI, a phase detector (PD), a first-order path (e.g., proportional path), a second-order loop (2OL), a phase integrator, a measurement component (e.g., logic hardware block), and a look-up-table (LUT) component (e.g., logic hardware block). For some example embodiments, the PI system forms part of a CDR system, such as one used to implement a high-speed serial interface. For various example embodiments, the measurement component is configured to receive phase error information (e.g., capture phase error data that comprises one or more phase error values) for an input data signal from the phase detector, receive frequency offset information from the second-order loop, receive phase position information/data for the input signal to the PI, and adjust mappings of one or more phase positions (e.g., one or more phase code values, hereafter one or more phase codes) to one or more adjusted phase positions received by the PI, where the adjusted phase positions reduce or correct for non-linearity (e.g., INL error) in the PI.

For some example embodiments, the measurement component tracks (e.g., monitors or accumulates) a phase error (e.g., phase error value) for each individual phase position (e.g., phase codes) of the PI (e.g., 0°, 90°, 180°, 270°). Additionally, for some example embodiments, the measurement component tracks (e.g., monitors or accumulates) a phase error for each individual phase position of the PI when a frequency offset (e.g., a frequency offset value provided by the second-order loop) indicates that the PI is rotating quickly (e.g., the frequency offset is high enough to cause PI to rotate quickly). According to various example embodiments, when the PI is rotating (e.g., spinning) quickly, a CDR is prevented from affecting the measurement results and the first-order path's output (e.g., phase error correction) cannot provide immediate phase adjustments to help reduce or correct for INL errors. Various example embodiments leverage the fact that a phase error (provided by the phase detector) is directly proportional to the INL error being generated by the PI when the PI is rotating quickly and the phase detector is locked to an input data signal (e.g., an incoming data stream). To operate, the measurement component can comprise multiple accumulators operating in parallel to measure phase error for multiple individual phase positions (e.g., individual phase codes) simultaneously. In this way, various example embodiments can enable fast measurement completion by the measurement component while permitting the system to handle other tasks in the background.

According to some example embodiments, the LUT component is positioned between the phase integrator (which provides current phase position information/data for the input data signal) and the PI to map (e.g., adjusts) the current phase position (e.g., PI phase code adjustments) to an adjusted phase position (or corrected phase position) based on a look-up table (LUT), where the LUT stores mappings (e.g., correction values) for corresponding phase positions, and where the look-up value is the current phase position provided by the phase integrator. In this way, the LUT can take in a current phase position (e.g., current phase code) as input and effectively map the current phase position to a different phase position to compensate for measured non-linearities and adjust the current phase position to match the desired/intended phase position (e.g., if current phase code 30 is found to have an error, the LUT can cause that to be mapped to an adjusted phase code of 28 to achieve the desired phase position). For various example embodiments, the measurement component is configured to perform continuous or periodic updates to the LUT mappings (e.g., correction values) based on the tracked phase errors. The LUT component can receive the current phase position (e.g., current phase code) from the phase integrator and can output an adjusted/corrected phase position, which can be provided to the phase interpolator as input. In some example embodiments, the adjusted/corrected phase position is combined with a phase error correction determined (e.g., generated) by the first-order path (based on the phase error from the phase detector) and the result of that combination is provided to the phase interpolator as input. Overall, the adjusted/corrected phase position provided to the PI can reduce or cancel out measured non-linearities within the PI system. Table 1 below illustrates an example LUT that comprises correction values that facilitate mapping of an input phase code (received from the phase integrator) to an adjusted phase code.

TABLE 1

| Input Phase Code | Correction Value |
|---|---|
| 0 | 0 |
| 20 | +2 |
| 30 | +4 |
| 64 | 0 |
| 84 | −2 |
| 100 | −4 |
| 128 | 0 |
| 148 | +2 |
| 164 | +4 |
| 192 | 0 |
| 212 | −2 |
| 228 | −4 |
| 255 | 0 |

For some example embodiments, the PI system comprises a delay (e.g., programmable variable delay) component that is used to provide the measurement component with a last phase position information (e.g., last phase code to the PI), thereby enabling the PI system to account for loop latency (e.g., a well-known delay) and enabling the measurement component to accurately associate phase error with the appropriate phase position.

Overall, various example embodiments described herein enable a PI (e.g., in a CDR system of a SerDes circuit or the like) to provide a technical solution for reducing or correct INL errors (e.g., due to IQ skew, inherent non-linear mixing behavior, and DAC current mismatch). According to various example embodiments, the technical solution provide for tracking (e.g., monitoring) phase error measurement data for different phase positions (e.g., during high-speed PI rotation), updating of a LUT based on the tracked phase error measurement data, and use of the LUT to dynamically map phase codes to compensate for the measured non-linearity, effectively reducing or canceling out the phase shifts due to INL errors. Additionally, various example embodiments described herein provide the technical solution without requiring additional hardware in a main clock path. The reduction/correction provided by various example embodiments can be continuous or periodic without disrupting data transmission, and updates to the LUT can be in real-time.

As used herein, a phase code (or PI phase code) can comprise a digital value that maps to a specific phase position in a phase interpolator. Generally, the phase interpolator receives a phase code and uses the phase code to generate multiple evenly spaced phase steps between the main clock phases (e.g., I at 0°, Q at 90°, IB at 180°, and QB at 270°), which can be used to sample an input data signal. For example, a phase interpolator can have 128 phase codes per unit interval (UI) and 256 total phase codes covering two UIs. As described herein, in an ideal system, incrementing a phase code should result in linear phase progression. However, due to non-linearities in actual (e.g., real-world) systems, a particular phase code may not produce its intended phase position, resulting in INL error that various embodiments described here can correct using a LUT mapping.

Reference will now be made in detail to various example embodiments of the present disclosure, examples of which are illustrated in the appended drawings. The present disclosure may, however, be embodied in many different forms and should not be construed as being limited to the examples set forth herein.

FIG. 1 is a schematic illustrating an example phase interpolator system 100 (hereafter, PI system 100) with measurement-based INL error handling, according to some example embodiments. As shown, the PI system 100 comprises a phase detector 102 (PD 102), a second-order loop 104 (2OL 104), a phase integrator 106, a measurement component 108, a first-order path 110, a look-up-table component 112 (LUT component 112), an adder component 114, a delay component 116, and a phase interpolator (PI 118). An output of the PD 102 is operatively coupled to an input of 2OL 104, an input of the first-order path 110, and an input of the measurement component 108. An output of the 2OL 104 is operatively coupled to an input of phase integrator 106 and an input of measurement component 108. An output of the first-order path 110 is operatively coupled to an input of the phase integrator 106 and an input of the adder component 114. An output of the LUT component 112 is operatively coupled to an input of the adder component 114. An output of the adder component 114 is operatively coupled to an input of the delay component 116 and an input of the PI 118. An output of the delay component 116 is operatively coupled to an input of the measurement component 108. An output of the measurement component 108 is operatively coupled to an input of the LUT component 112. An output of the PI 118 is operatively coupled to an output of the PD 102.

According to various example embodiments, the PD 102 is configured to receive an input data signal (e.g., input data stream from a transmitter), receive an interpolated clock signal generated by the PI 118, and determine a phase error (e.g., phase error information) of the interpolated clock signal based on the input data signal and the interpolated clock signal. For instance, the PD 102 determines the phase error (e.g., generates phase error signal) by comparing a phase of the interpolated clock signal against a phase of the input data signal. The phase error can comprise a phase error signal generated by the PI 118. For various example embodiments, the first-order path 110 (e.g., proportional path) is configured to determine (e.g., generate) a phase error correction for the interpolated clock signal based on the phase error. The first-order path 110 can provide the phase error correction by taking the phase error (e.g., phase error signal) from the PD 102 and apply it with a gain factor, without integration.

For some example embodiments, the 2OL 104 is configured to determine a frequency offset (e.g., frequency offset value) of the interpolated clock signal based on the phase error, and the phase integrator 106 is configured to determine (e.g., generate) a first phase position (of the interpolated clock signal) based on the frequency offset and the phase error correction. According to some example embodiments, the LUT component 112 is configured to map the first phase position to a second phase position based on a look-up table (LUT). The LUT can be part of the LUT component 112. For some example embodiments, the look-up table comprises one or more phase position correction values corresponding to different phase positions, and the LUT component 112 maps the first phase position to the second phase position based on the look-up table by identifying, in the look-up table, a select (phase position) correction value that corresponds to the first phase position (from the phase integrator), and by applying the select correction value to the first phase position to determine (e.g., generate) the second phase position. For various example embodiments, the adder component 114 (e.g., summation component) is configured to combine the phase error correction (from the first-order path 110) and the second phase position from the LUT component 112 to generate an adjusted phase position. Table 1 provided herein illustrates an example LUT that comprises phase position correction values that facilitate mapping of an input phase code (received from the phase integrator) to an adjusted phase code. Eventually, the adjusted phase position from the adder component 114 is received by the PI 118, which is configured to generate the interpolated clock signal based on the adjusted phase position. As shown, the interpolated clock signal is fed back (e.g., looped back) to the PD 102 to facilitate continuous phase error determination (e.g., generation), phase error measurement, and INL error reduction/correction in the PI system 100. For various example embodiments, the delay component 116 is configured to receive the adjusted phase position and determine (e.g., generate) a last phase position, which is provided to the measurement component 108. Depending on the example embodiment, the delay component 116 can comprise a programmable delay, which can account/compensate for known latency within the PI system 100 (e.g., loop latency between the adjusted phase position received by the PI 118 and a corresponding phase error measurement determined by the PD 102).

According to various example embodiments, the measurement component 108 enables the PI system 100 to update the LUT of the LUT component 112 as INL error changes in the PI system 100. For some example embodiments, the measurement component 108 is configured to track, over a plurality of phase rotations of the phase interpolator, a plurality of phase errors for a corresponding plurality of (different) phase positions (e.g., different phase codes) based on the frequency offset (from the 2OL 104), the last phase position of the interpolated clock signal (from the delay component 116), and the phase error (from the PD 102). In this way, the measurement component 108 can associate (measured) phase errors with corresponding phase positions (e.g., phase codes). The measurement component 108 of various example embodiments updates the look-up table based on at least one tracked phase error of the plurality of phase errors. For example, the measurement component can update the look-up table by inverting a select tracked phase error of the plurality of phase errors, for a select phase position of the corresponding plurality of phase positions, to determine (e.g., generate) an updated phase position correction value for the select phase position, and update the look-up table with the updated phase position correction value for the select phase position.

To track phase errors for different phase positions, the measurement component 108 can comprise a plurality of accumulators that operate in parallel to track the plurality of phase errors for the corresponding plurality of phase positions simultaneously (over the plurality of phase rotations of the phase interpolator) based on the last phase position and the phase error. Each accumulator can measure phase error for a different phase position (e.g., phase codes). The accumulation of phase errors, for different phase positions, over multiple PI rotations, can enable various example embodiments to average the error and filter out noise. A microcontroller of the measurement component 108 can control operation of the plurality of accumulators. The microcontroller of the measurement component 108 can manage the transfer of one or more updates (e.g., correction value updates) to the look-up table, thereby allowing look-up table updates to occur continuously during normal operation and use of the PI system 100 (e.g., in circuit 400). The measurement component 108 of some example embodiments is designed to take advantage of a quadrant-based operation of the PI system 100. For instance, when the PI 118 is operating in one quadrant, the measurement component 108 can measure and update the look-up table for other quadrants that are not currently active. In this way, the LUT can be updated for an upcoming quadrant based on awareness of where the PI system 100 is now.

During operation, the measurement component 108 can determine whether the frequency offset value (e.g., frequency offset value) from the 2OL 104 indicates that the PI 118 is rotating above a threshold speed and, in response to determining that the phase interpolator is rotating above the threshold speed, the measurement component 108 can operate the plurality of accumulators in parallel to track the plurality of phase errors for the corresponding plurality of phase positions simultaneously (over the plurality of phase rotations of the phase interpolator) based on the last phase position and the phase error. In this way, phase error is accumulated for each different phase position as long as the frequency offset indicates that the PI 118 is rotating above the threshold speed. For various example embodiments, when the PI 118 is rotating above the threshold speed (e.g., spinning quickly), a CDR (of which the PI system 100 is part of) is prevented from affecting measurements collected by the measurement component 108. Depending on the example embodiment, the frequency offset can comprise a value that represents frequency variation in parts per a million (ppm), and the threshold speed can comprise a value that represents frequency variation in ppm. For instance, the threshold speed can comprise a value of 1500 ppm, a frequency offset of 2000 ppm can indicate that the phase of the PI is rotating at a high speed. In response to determining that phase interpolator is not rotating above the threshold speed, the measurement component 108 can stop or pause tracking of the plurality of phase errors for the corresponding plurality of phase positions.

For some example embodiments, the first phase position (from the phase integrator 106) comprises a first phase code, the second phase position (from the LUT component 112) comprises a second phase code, the last phase position (from the delay component 116) comprises a last phase code, and the adjusted phase position (from the adder component 114) comprises an adjusted phase code. Additionally, for some example embodiments, the LUT comprises phase code correction values that correspond to different phase codes, where a first phase code received from the phase integrator 106 is used to search the look-up table and retrieve a select phase code correction value located for the first phase code. The phase code correction values can represent mappings/re-mappings of phase codes. For various example embodiments, a select phase code correction value is determined (e.g., generate) for a select phase error by inverting the given phase error (to determine the select phase code correction value). An individual phase code correction value can have a resolution of a single phase code. Additionally, individual phase code correction values in the LUT can be applied individually to corresponding phase codes, or consecutive pairs of phase code correction values can be applied to corresponding phase codes (to reduce hardware requirements while maintaining effectiveness for slowly changing non-linearities).

During operation of PI system 100, when the PI 118 is rotating slowly, the first-order path 110 can help correct INL errors (within the PI system 100) through immediate phase adjustments provided to the PI 118 through the adder component 114. During high-speed PI rotation (e.g., during SSC operation), the filtering in the first-order path 110 can prevent it from effectively reducing or correcting high-frequency INL errors (within the PI system 100) because the phase error provided by the PD 102 changes too rapidly for the first-order path 110 to track and correct. The first-order path 110 operates in parallel with the 2OL 104, the phase integrator 106, and the LUT component 112, where the output of the first-order path 110 and the output of the LUT component 112 are combined (e.g., summed) by the adder component 114 to generate an adjusted phase position that is provided as an input to the PI 118. The parallel structure of the first-order path 110 and the path of the 2OL 104 allows the first-order path 110 to reduce latency in the phase error correction while the 2OL 104 can handle frequency offset tracking.

The PI system 100 of various example embodiments involve computations that are simple and measurements time that is relatively short, rendering the PI system 100 easier to physically implement in silicon.

Figure 2:
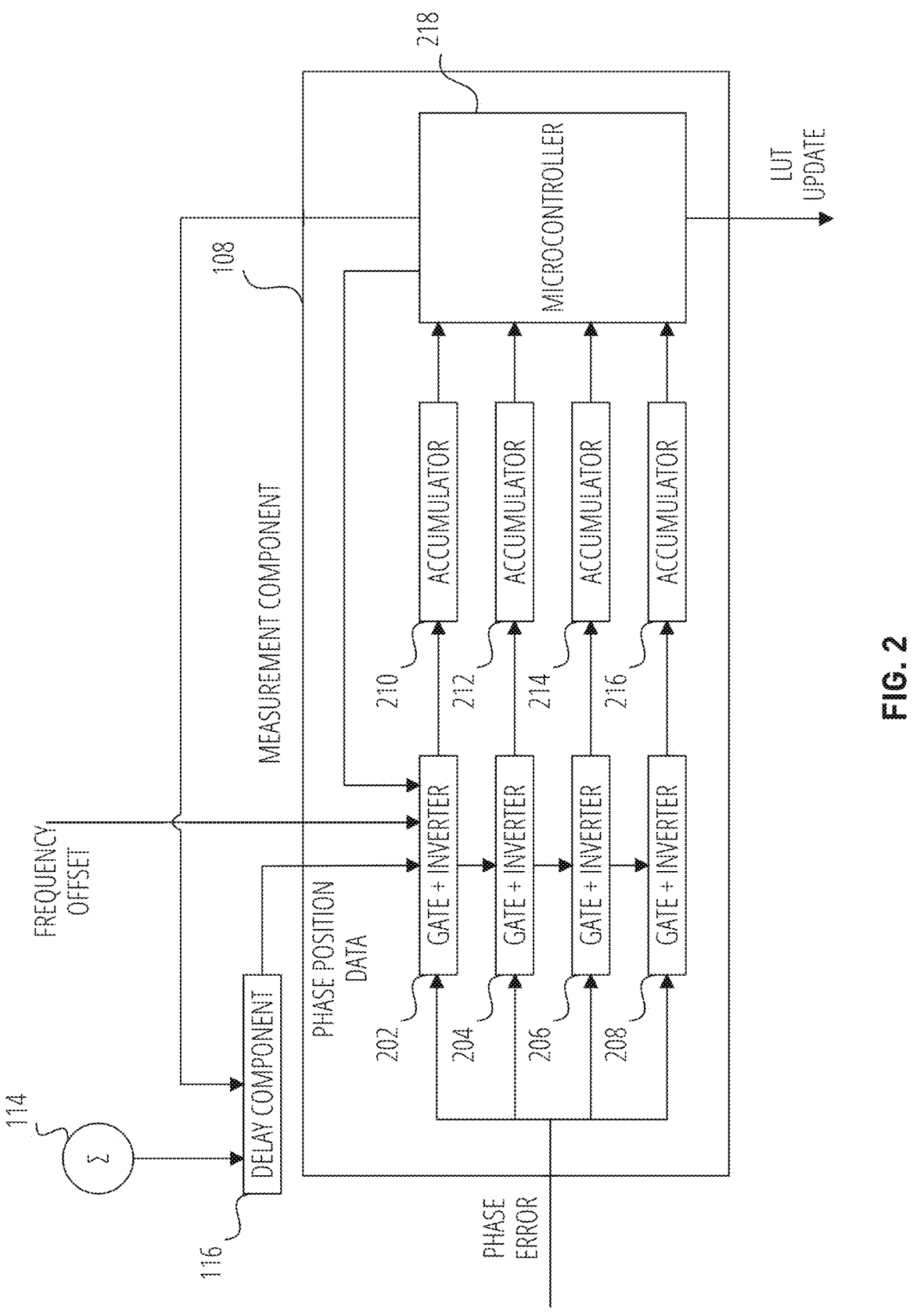
FIG. 2 is a schematic illustrating an example implementation of a measurement component used by a PI system, according to some example embodiments.

FIG. 2 is a schematic illustrating an example implementation of the measurement component 108 used by the PI system 100, according to some example embodiments. As shown, the measurement component 108 comprises multiple sets of gates and inverters 202, 204, 206, 208 associated with the four phase positions (e.g., I at 0°, Q at 90°, IB at 180°, and QB at 270°) for which the measurement component 108 is tracking phase error, and accumulators 210, 212, 214, 216 associated with the four phase positions, where gate+inverter 202 outputs into accumulator 210, gate+inverter 204 outputs into accumulator 212, gate+inverter 206 outputs into accumulator 214, and gate+inverter 208 outputs to accumulator 216. The measurement component 108 also comprises a microcontroller 218 that is configured to control operation gates+inverters 202, 204, 206, 208 and the accumulators 210, 212, 214, 216. When the PI system 100 is in a given phase position (determined based on phase position data from delay component 116) and when a frequency offset (from the 2OL 104) indicates that the PI system 100 is rotating above a threshold speed, the microcontroller 218 can cause a gate+inverter (e.g., 202, 204, 206, 208) associated with the given phase position to receive as input a phase error (e.g., from the PD 102), invert the received phase error to generate a correction value (e.g., phase code correction value), and cause the correction value to be accumulated in an accumulator (e.g., 210, 212, 214, 216) associated with the given phase position. In this way, the measurement component 108 can track phase errors for different phase positions. Additionally, the accumulator (e.g., 210, 212, 214, 216) associated with the given phase position can provide a current, accumulated correction value (e.g., phase code correction value) to the microcontroller 218, which can use the current, accumulated correction value to a look-up table of the LUT component 112 in association with the given phase position (e.g., transfer the current, accumulated correction value to the LUT component 112, thereby enabling the LUT component 112 to update its look-up table accordingly).

FIG. 3 presents schematics for an example first-order path 302 and an example second-order loop 304 that are part of a PI system, according to some example embodiments. As shown, the first-order path 302 comprises a gain component 306 (e.g., an amplifier or the like) that receives a phase error as an input signal and applies a gain to the input signal (e.g., increases the amplitude of the input signal) to generate a phase error correction. As a result, the phase error correction is proportional to the phase error received as an input signal.

The second-order loop 304 as shown comprises a gain component 308 (e.g., an amplifier or the like), an adder component 310, and a flip-flop 312, where an output of the gain component 308 is operatively coupled to an input of the adder component 310, an output of the adder component 310 is operatively coupled to an input of the flip-flop 312, and an output of the flip-flop 312 is operatively coupled to an input to the adder component 310. During operation, the gain component 308 receives a phase error as an input signal and applies a gain to the input signal (e.g., increases the amplitude of the input signal) to generate an amplified signal. The adder component 310 and the flip-flop 312 forms a loop configured to generate the frequency offset based on the amplified signal. Specifically, the adder component 310 combines the amplified signal with a feedback signal provided by the flip-flop 312 to generate a frequency offset, and the flip-flop 312 stores the last output generated by the adder component 310. As a result, the second-order loop 304 generates the frequency offset as a scaled integration of the phase error received as an input signal.

Figure 4:
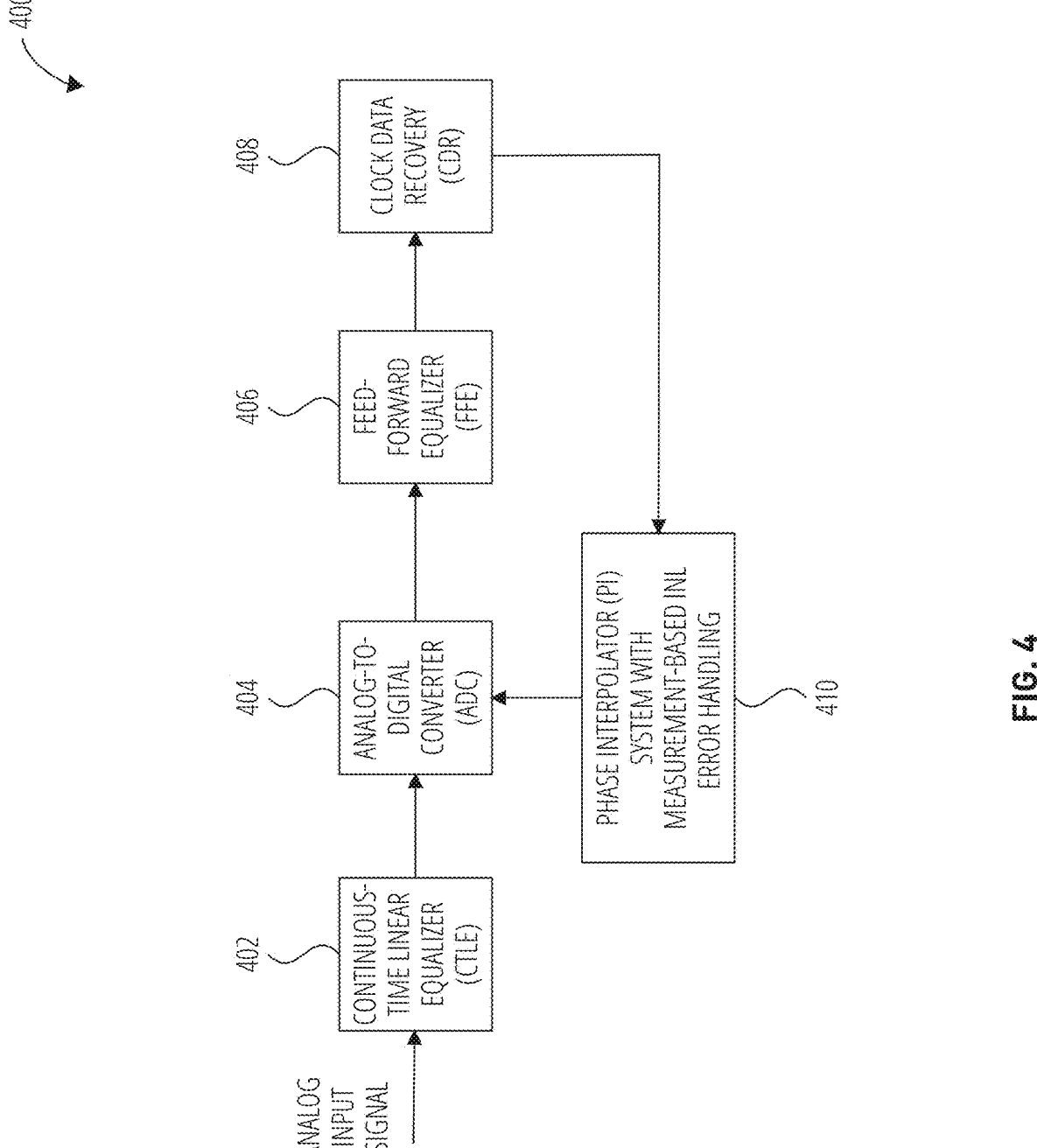
FIG. 4 is a schematic illustrating an example circuit comprising a PI system with measurement-based INL error handling, according to some example embodiments.

FIG. 4 is a schematic illustrating an example circuit 400 comprising a phase interpolator system 410 with measurement-based INL error handling (hereafter, the CDR 408), according to some example embodiments. According to various example embodiments, the PI system 410 is implemented in accordance with the PI system 100 illustrated and described with respect to FIG. 1. Depending on the example embodiment, the circuit 400 can be part of a receiver (e.g., of a SerDes).

As shown, the circuit 400 comprises a continuous-time linear equalizer 402 (CTLE 402), an analog-to-digital converter 404 (ADC 404), a feed-forward equalizer 406 (FFE 406), a clock and data recovery component 408 (CDR 408), and the PI system 410. During operation of the circuit 400, the CTLE 402 receives an analog input signal (e.g., from a transmitter) and generates an equalized analog signal based on the analog input signal. The ADC 404 receives the equalized analog signal and generates a digital signal based on the equalized analog signal (by using an interpolated clock signal from the PI system 410 to sample the equalized analog signal). The FFE 406 receives the digital signal and generates an equalized digital signal. The CDR 408 receives the equalized digital signal and performs clock and data recovery based on the equalized digital signal. The PI system 410 generates the interpolated clock signal based on a signal (e.g., control signal) generated by the CDR 408. According to various example embodiments, the signal from the CDR 408 controls interpolation of a clock signal generated by the PI system 410, and the interpolated clock signal generated by the PI system 410 is used by the ADC 404 to sample the equalized analog signal generated by the CTLE 402.

Figure 5:
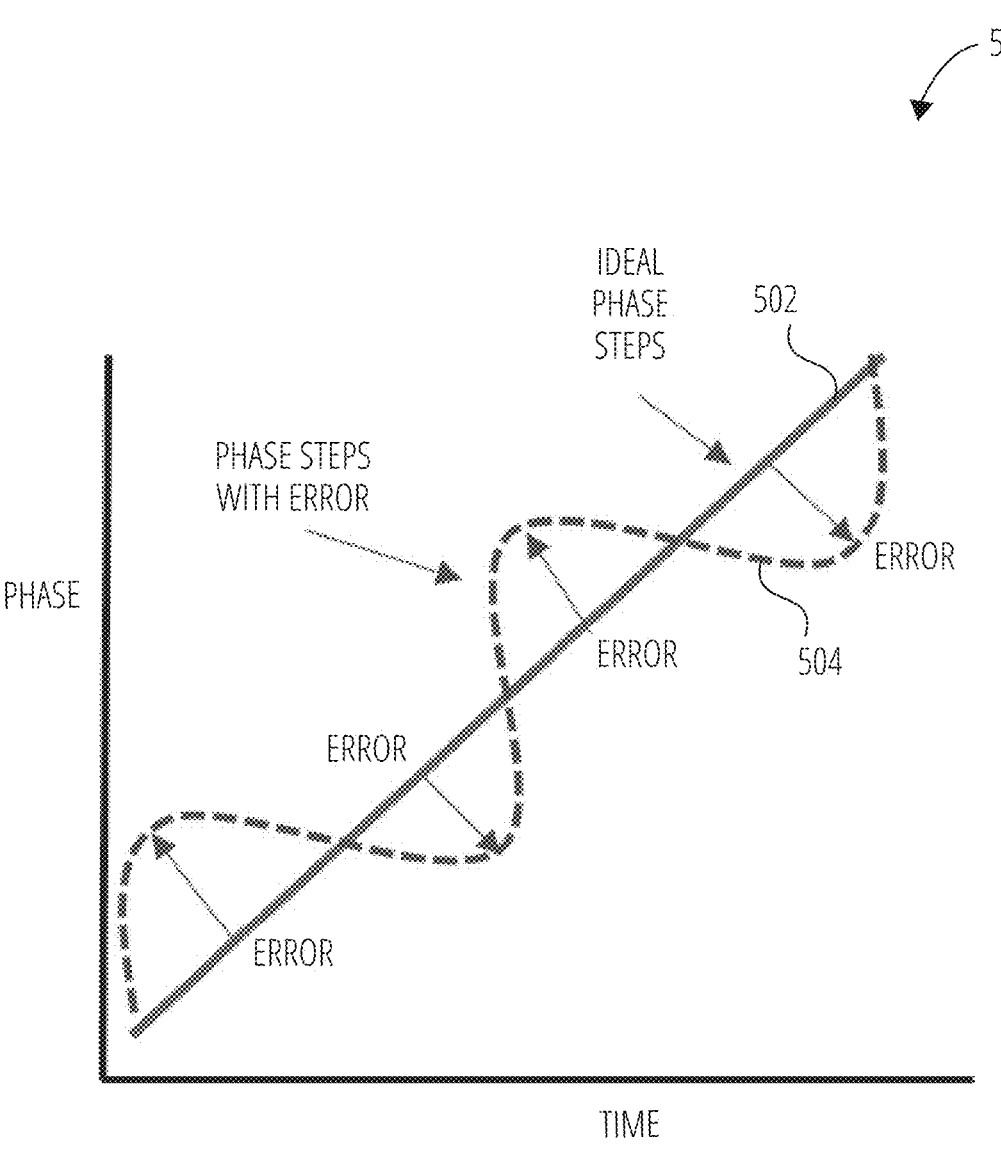
FIG. 5 presents a graph that illustrates a comparison of an example linear phase shift of an ideal PI system as the phase interpolator rotates around a full cycle and an example non-linear phase shift of a real PI system as the phase interpolator rotates around a full cycle.

FIG. 5 presents the graph 500, which illustrates a comparison of an example linear phase shift of an ideal PI system as the phase interpolator rotates around a full cycle and an example non-linear phase shift of a real PI system as the phase interpolator rotates around a full cycle. In particular, the linear phase shift (due to ideal phase steps) of an ideal PI system is illustrated by the solid line 502, while the non-linear phase shift (due phase steps with INL errors) of an actual (e.g., real world) PI systems without INL error handling is illustrated by the dashed line 504.

FIG. 6 is a flowchart illustrating an example method 600 for handling phase interpolator INL errors based on phase error measurements, according to some example embodiments. Some or all of the method 600 can be performed by a circuit that includes the PI system as described herein, such as the circuit 400 described herein with respect to FIG. 4. Depending on the embodiment, an operation of an example method described herein can be repeated in different ways or involve intervening operations not shown. Though the operations of example methods may be depicted and described in a certain order, the order in which the operations are performed may vary among embodiments, including performing certain operations in parallel.

Referring now to FIG. 6, at operation 602, a phase detector of a circuit (e.g., 400) receives an input data signal and an interpolated clock signal generated by a phase interpolator of the circuit. For operation 604, the phase detector determines (e.g., generates) a phase error (e.g., a phase error signal) of the interpolated clock signal based on the input data signal and the interpolated clock signal (e.g., compares a phase of the input data signal against a phase of the interpolated clock signal). At operation 606, a first-order path (e.g., proportional path) of the circuit determines (e.g., generates) a phase error correction for the interpolated clock signal based on the phase error. During operation 608, a second-order loop of the circuit determines (e.g., generates) a frequency offset of the interpolated clock signal based on the phase error. At operation 610, a phase integrator of the circuit determines (e.g., generates) a first phase position (of the interpolated clock signal) based on the frequency offset and the phase error correction. For operation 612, a look-up-table (LUT) component of the circuit maps the first phase position to a second phase position based on a look-up table of the LUT component. At operation 614, an adder component of the circuit combines the phase error correction and the second phase position to generate an adjusted phase position. During operation 616, a delay component of the circuit generates the last phase position based on the adjusted phase position. At operation 618, a measurement component of the circuit tracks, over a plurality of phase rotations of the phase interpolator, a plurality of phase errors for a corresponding plurality of phase positions based on the frequency offset, a last phase position of the interpolated clock signal, and the phase error. For operation 620, the measurement component updates the look-up table based on at least one tracked phase error of the plurality of phase errors. At operation 622, the phase interpolator generates the interpolated clock signal based on the adjusted phase position.

FIG. 7 is a flowchart illustrating an example method 700 for generating a circuit design including a phase interpolator system with measurement-based INL error handling, in accordance with some embodiments. It will be understood that the method 700 can be performed by a device, such as a computing device executing instructions of an EDA software system, in accordance with some embodiments. Additionally, the method 700 herein can be implemented in the form of executable instructions stored on a computer-readable medium or in the form of electronic circuitry. For instance, the operations of the method 700 may be represented by executable instructions that, when executed by a processor of a computing device, cause the computing device to perform the method 700. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Referring now to FIG. 7, at operation 702, a processor configures, in a circuit design, a phase detector that is configured to receive an input data signal, receive an interpolated clock signal generated by a phase interpolator, and determine a phase error of the interpolated clock signal based on the input data signal and the interpolated clock signal. During operation 704, the processor configures, in the circuit design, a first-order path that is configured to determine a phase error correction for the interpolated clock signal based on the phase error. For operation 706, the processor configures, in the circuit design, a second-order loop that is configured to determine a frequency offset of the interpolated clock signal based on the phase error. At operation 708, the processor configures, in the circuit design, a phase integrator that is configured to determine a first phase position (of the interpolated clock signal) based on the frequency offset and the phase error correction. For operation 710, the processor configures, in the circuit design, a look-up-table (LUT) component that is configured to map the first phase position to a second phase position based on a look-up table. During operation 712, the processor configures, in the circuit design, an adder component that is configured to combine the phase error correction and the second phase position to generate an adjusted phase position. At operation 714, the processor configures, in the circuit design, a delay component that is configured to receive the adjusted phase position and generate the last phase position. For operation 716, the processor configures, in the circuit design, a measurement component that is configured to: track, over a plurality of phase rotations of the phase interpolator, a plurality of phase errors for a corresponding plurality of phase positions based on the frequency offset, a last phase position of the interpolated clock signal, and the phase error; and update the look-up table based on at least one tracked phase error of the plurality of phase errors. At operation 718, the processor configures the phase interpolator in the circuit design, where the phase interpolator is configured to generate the interpolated clock signal based on the adjusted phase position.

Figure 8:
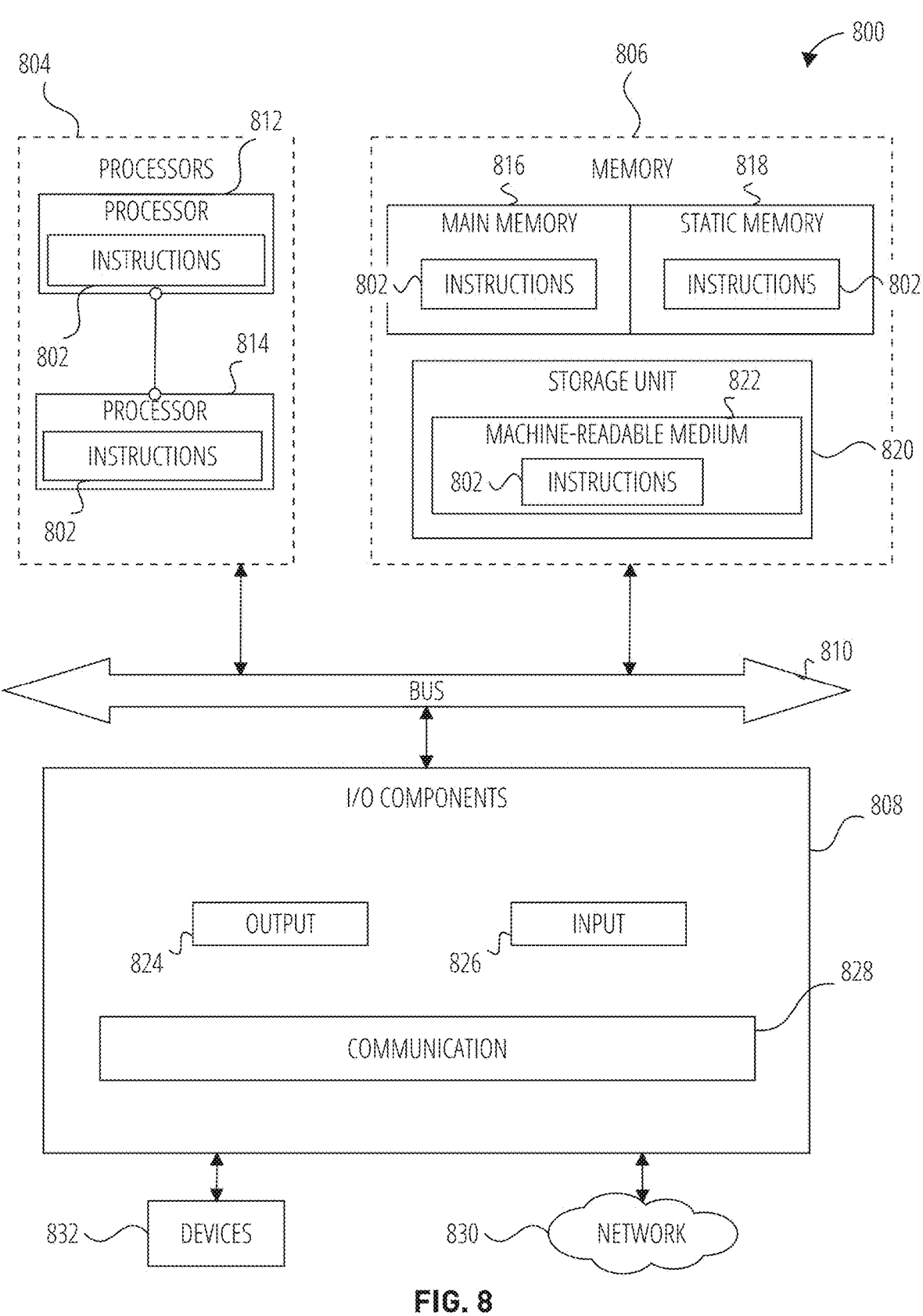
FIG. 8 is a diagrammatic representation of a machine in the form of a computer system within which a set of instructions may be executed to cause the machine to perform any one or more of the methodologies discussed herein, according to some example embodiments.

FIG. 8 is a diagrammatic representation of the machine 800 in the form of a computer system within which a set of instructions may be executed to cause the machine 800 to perform any one or more of the methodologies discussed herein, according to some example embodiments. FIG. 8 shows components of the machine 800, which is, according to some example embodiments, able to read instructions from a machine-readable medium (e.g., a machine-readable storage medium) and perform any one or more of the methodologies discussed herein. Specifically, FIG. 8 shows a diagrammatic representation of the machine 800 in the example form of a computer system, within which instructions 802 (e.g., software, a program, an application, an applet, an app, or other executable code) cause the machine 800 to perform any one or more of the methodologies discussed herein can be executed. In alternative embodiments, the machine 800 operates as a standalone device or can be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 can comprise, but not be limited to, a server computer, a client computer, a personal computer (PC), a tablet computer, a laptop computer, a netbook, or any machine capable of executing the instructions 802, sequentially or otherwise, that specify actions to be taken by the machine 800. Further, while only a single machine 800 is illustrated, the term "machine" shall also be taken to include a collection of machines 800 that individually or jointly execute the instructions 802 to perform any one or more of the methodologies discussed herein.

In various example embodiments, the machine 800 comprises processors 804, memory 806, and I/O components 808, which can be configured to communicate with each other via a bus 810. In some example embodiments, the processors 804 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 812 and a processor 814 that may execute the instructions 802. The term "processor" is intended to include multi-core processors that can comprise two or more independent processors 812, 814 (also referred to as "cores") that can execute the instructions 802 contemporaneously. Although FIG. 8 shows multiple processors 804, the machine 800 may include a single processor 812 with a single core, a single processor 812 with multiple cores (e.g., a multi-core processor), multiple processors 804 with a single core, multiple processors 804 with multiple cores, or any combination thereof.

The memory 806 comprises a main memory 816, a static memory 818, and a storage unit 820 accessible to the processors 804 via the bus 810, according to some example embodiments. The storage unit 820 can include a machine-readable medium 822 on which are stored the instructions 802 embodying any one or more of the methodologies or functions described herein. The instructions 802 can also reside, completely or at least partially, within the main memory 816, within the static memory 818, within at least one of the processors 804 (e.g., within the processor's cache memory), or any suitable combination thereof, during execution thereof by the machine 800. Accordingly, in various example embodiments, the main memory 816, the static memory 818, and the processors 804 are considered machine-readable media machine-readable medium 822.

As used herein, the term "memory" refers to a machine-readable medium 822 able to store data temporarily or permanently and may be taken to include, but not be limited to, random-access memory (RAM), read-only memory (ROM), buffer memory, flash memory, and cache memory. While the machine-readable medium 822 is shown, in some example embodiments, to be a single medium, the term "machine-readable medium" should be taken to include a single medium or multiple media (e.g., a centralized or distributed database, or associated caches and servers) able to store the instructions 802. The term "machine-readable medium" shall also be taken to include any medium, or combination of multiple media, that is capable of storing instructions (e.g., the instructions 802) for execution by a machine (e.g., the machine 800), such that the instructions, when executed by one or more processors of the machine (e.g., the processors 804), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 808 include a wide variety of components to receive input, provide output, produce output, transmit information, exchange information, capture measurements, and so on. In general, it will be appreciated that the I/O components 808 can include many other components that are not shown in FIG. 8. The I/O components 808 are grouped according to functionality merely to simplify the following discussion, and the grouping is in no way limiting. In various example embodiments, the I/O components 808 include output components 824 and input components 826. The output components 824 include visual components (e.g., a display (or hardware display) such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 826 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

Communication can be implemented using a wide variety of technologies. The I/O components 808 may include communication components 828 operable to couple the machine 800 to a network 830 or devices 832 via respective couplings. For example, the communication components 828 include a network interface component or another suitable device to interface with the network 830. In further examples, the communication components 828 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 832 may be another machine or any of a wide variety of peripheral devices (e.g., a peripheral device coupled via a USB).

In various example embodiments, one or more portions of the network 830 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 830 or a portion of the network 830 may include a wireless or cellular network.

Furthermore, the machine-readable medium 822 is non-transitory (in other words, not having any transitory signals) in that it does not embody a propagating signal. However, labeling the machine-readable medium 822 "non-transitory" should not be construed to mean that the machine-readable medium 822 is incapable of movement; the machine-readable medium 822 should be considered as being transportable from one physical location to another. Additionally, since the machine-readable medium 822 is tangible, the machine-readable medium 822 may be considered to be a machine-readable device.

Figure 9:
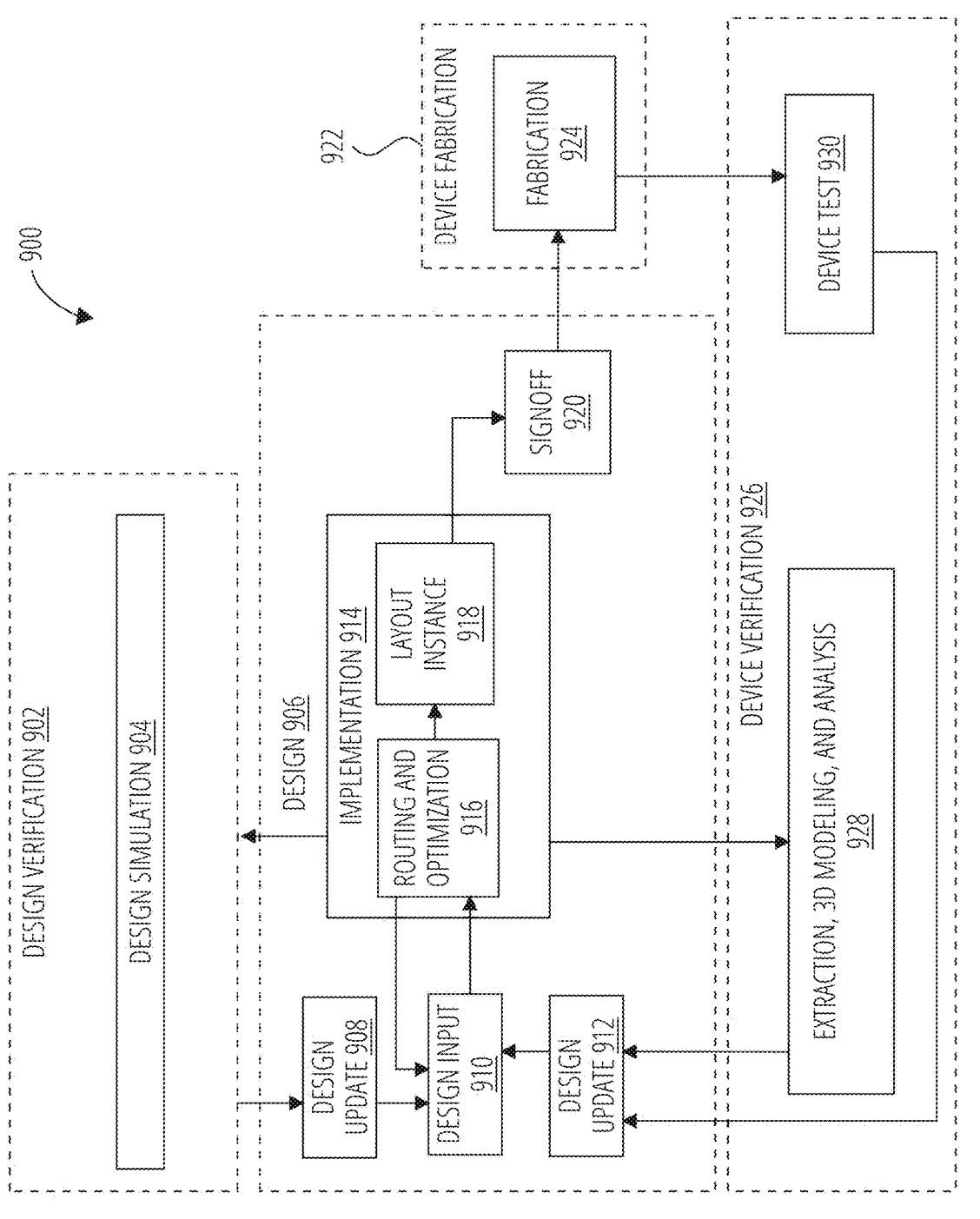
FIG. 9 is a diagram illustrating an example design process flow for generating a circuit, including embodiments to implement a phase interpolator system with measurement-based INL error handling as described herein, and in some example embodiments, to integrate the phase interpolator system with measurement-based INL error handling with a larger circuit.

FIG. 9 is a diagram illustrating an example design process flow 900 for generating a circuit, including embodiments to implement a phase interpolator system with measurement-based INL error handling as described herein, and in some example embodiments, to integrate the phase interpolator system with measurement-based INL error handling with a larger circuit (e.g., SerDes circuit). As shown, the design process flow 900 includes a design phase 906, a device fabrication phase 922, a design verification phase 902, and a device verification phase 926. The design phase 906 involves an initial design input 910 operation where the basic elements and functionality of a device are determined, and revisions are made based on various analyses and optimization of a circuit design. This design input 910 operation is where block instances are used in the circuit design and any additional circuitry for the design around the blocks is selected. The initial strategy, tactics, and context for the device to be created are also generated in the design input 910 operation, depending on the particular design algorithm to be used.

In some example embodiments, following an initial selection of design values in the design input 910 operation, routing, timing analysis, and optimization are performed in an implementation operation 914, which includes a routing and optimization 916 operation and generating a layout instance 918, along with any other automated design processes. Routing and optimization 916 may occur prior to the layout instance 918, and timing analysis, routing and optimization 916 may be performed at any time to verify operation of a circuit design. For instance, in various example embodiments, timing analysis in a circuit design may be performed prior to routing of connections in the circuit design, after routing, during register transfer level (RTL) operations, or as part of a signoff 920, as described below.

Though not shown, the routing and optimization 916 operation can include a clock tree synthesis (CTS) operation, which can generate one or more clock trees that deliver clock signal from clock sources of a circuit design to a plurality of clock tree leaf nodes comprising clock tree sinks (e.g., flip-flops) within the circuit design. The routing and optimization 916 operation may also include other operations not shown, such as those relating to floor-planning, placement, post-placement optimization, and post-routing optimization.

Design inputs are used in the design input 910 operation. These may be further processed during the design input 910 operation via a process, such as logic-synthesis to generate a circuit netlist mapped to a target standard library manufacturable by the foundry in fabrication operation 924. This netlist is placed by the layout instance 918 and optimized and routed by routing and optimization 916 operation, and a clock tree is inserted by CTS. Operations 916, and 918 may have a close interrelation and may be simultaneously optimized by processes similar to CCOPT. Prior to the routed, placed and optimized netlist being provided to a fabrication operation 924, the signoff 920 is performed on the circuit design defined by the layout.

After signoff verification by the signoff 920, a verified version of the layout is used in the fabrication operation 924 to generate a device, or additional testing and design updates may be performed using designer inputs or automated updates based on design simulation 904 operations or extraction, 3D modeling, and analysis 928 operations. Once the device is generated, the device can be tested as part of device test 930 operations, and layout modifications generated based on actual device performance.

As described in more detail below, a design update 908 from the design simulation 904; a design update 912 from the device test 930 or the extraction, 3D modeling, and analysis 928 operations; or from the design input 910 operation may occur after the initial layout instance is generated by the layout instance 918 operation. In various example embodiments, whenever design inputs are used to update or change an aspect of a circuit design, a timing analysis and the routing and optimization 916 operation may be performed.

For example, in various example embodiments, a user may provide an input to a computing device indicating placement of elements of a circuit within a circuit design, including a description of circuitry for a phase interpolator system as described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to example embodiments described herein. Such circuit design files may be used as outputs to generate photolithographic masks or other control files and components used to generate circuits that operate in accordance with various example embodiments described herein.

Certain embodiments are described herein as including logic or a number of components, modules, elements, or mechanisms. Such components can constitute either software components (e.g., code embodied on a machine-readable medium or in a transmission signal) or hardware components. A "hardware component" is a tangible unit capable of performing certain operations and can be configured or arranged in a certain physical manner. In various example embodiments, one or more computer systems (e.g., a standalone computer system, a client computer system, or a server computer system) or one or more hardware components of a computer system (e.g., a processor or a group of processors) are configured by software (e.g., an application or application portion) as a hardware component that operates to perform certain operations as described herein.

In some example embodiments, a hardware component is implemented mechanically, electronically, or any suitable combination thereof. For example, a hardware component can include dedicated circuitry or logic that is permanently configured to perform certain operations. For example, a hardware component can be a special-purpose processor, such as a field-programmable gate array (FPGA) or an application-specific integrated circuit (ASIC). A hardware component may also include programmable logic or circuitry that is temporarily configured by software to perform certain operations. For example, a hardware component can include software encompassed within a general-purpose processor or other programmable processor. It will be appreciated that the decision to implement a hardware component mechanically, in dedicated and permanently configured circuitry, or in temporarily configured circuitry (e.g., configured by software) can be driven by cost and time considerations.

The term "hardware component" should be understood to encompass a tangible entity, be that an entity that is physically constructed, permanently configured (e.g., hardwired), or temporarily configured (e.g., programmed) to operate in a certain manner and/or to perform certain operations described herein. Considering example embodiments in which hardware components are temporarily configured (e.g., programmed), each of the hardware components need not be configured or instantiated at any one instance in time. For example, where the hardware components comprise a general-purpose processor configured using software, the general-purpose processor may be configured as respective different hardware components at different times. Software may accordingly configure a processor, for example, to constitute a particular hardware component at one instance of time and to constitute a different hardware component at a different instance of time.

Hardware components can provide information to, and receive information from, other hardware components. Accordingly, the described hardware components may be regarded as being communicatively coupled. Where multiple of such hardware components exist contemporaneously, communications may be achieved through signal transmission (e.g., over appropriate circuits and buses that connect the hardware components). In some example embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions. The components referred to herein may, in some example embodiments, comprise processor-implemented components.

Similarly, the methods described herein may be at least partially processor-implemented. For example, at least some of the operations of a method may be performed by one or more processors or processor-implemented components. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other example embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs). Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various example embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other example embodiments the processors may be distributed across a number of locations.

Boundaries between various resources, operations, components, engines, and data stores are somewhat arbitrary, and particular operations are illustrated in a context of specific illustrative configurations. Other allocations of functionality are envisioned and may fall within a scope of various example embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various example embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:

a phase detector configured to receive an input data signal, receive an interpolated clock signal generated by a phase interpolator, and determine a phase error of the interpolated clock signal based on the input data signal and the interpolated clock signal;

a first-order path configured to determine a phase error correction for the interpolated clock signal based on the phase error;

a second-order loop configured to determine a frequency offset of the interpolated clock signal based on the phase error;

a phase integrator configured to determine a first phase position based on the frequency offset and the phase error correction;

a look-up-table component configured to map the first phase position to a second phase position based on a look-up table;

an adder component configured to combine the phase error correction and the second phase position to generate an adjusted phase position;

a measurement component configured to:

over a plurality of phase rotations of the phase interpolator, track a plurality of phase errors for a corresponding plurality of phase positions based on the frequency offset, a last phase position of the interpolated clock signal, and the phase error; and update the look-up table based on at least one tracked phase error of the plurality of phase errors; and the phase interpolator configured to generate the interpolated clock signal based on the adjusted phase position.

2. The circuit of claim 1, wherein the first phase position comprises a first phase code, wherein the second phase position comprises a second phase code, wherein the last phase position comprises a last phase code, wherein the adjusted phase position comprises an adjusted phase code.

3. The circuit of claim 1, wherein the measurement component comprises a plurality of accumulators that operate in parallel to track the plurality of phase errors for the corresponding plurality of phase positions simultaneously, over the plurality of phase rotations of the phase interpolator, based on the last phase position and the phase error.

4. The circuit of claim 3, wherein the measurement component comprises a microcontroller configured to control operation of the plurality of accumulators.

5. The circuit of claim 1, comprising:

a delay component configured to receive the adjusted phase position and generate the last phase position.

6. The circuit of claim 1, wherein the measurement component comprises a plurality of accumulators, and wherein the measurement component is configured to:

determine whether the frequency offset indicates that the phase interpolator is rotating above a threshold speed; and in response to determining that the phase interpolator is rotating above the threshold speed, operate the plurality of accumulators in parallel to track the plurality of phase errors for the corresponding plurality of phase positions simultaneously, over the plurality of phase rotations of the phase interpolator, based on the last phase position and the phase error.

7. The circuit of claim 1, wherein the look-up-table component is operatively coupled between the phase integrator and the phase interpolator.

8. The circuit of claim 1, wherein the look-up table comprises one or more phase position correction values corresponding to different phase positions.

9. The circuit of claim 8, wherein the look-up-table component maps the first phase position to the second phase position based on the look-up table by:

identifying, in the look-up table, a select correction value that corresponds to the first phase position; and applying the select correction value to the first phase position to generate the second phase position.

10. The circuit of claim 1, wherein the measurement component is configured to:

determine whether the frequency offset indicates that the phase interpolator is rotating below a threshold speed, the measurement component being configured to update the look-up table based on the at least one tracked phase error in response to determining that the phase interpolator is rotating below the threshold speed.

11. The circuit of claim 1, wherein the measurement component updates the look-up table based on the at least one tracked phase error by:

inverting a select tracked phase error of the plurality of phase errors, for a select phase position of the corresponding plurality of phase positions, to generate an updated phase position correction value for the select phase position; and updating the look-up table with the updated phase position correction value for the select phase position.

12. A method comprising:

receiving, by a phase detector of a circuit, an input data signal and an interpolated clock signal generated by a phase interpolator of the circuit;

determining, by the phase detector, a phase error of the interpolated clock signal based on the input data signal and the interpolated clock signal;

determining, by a first-order path of the circuit, a phase error correction for the interpolated clock signal based on the phase error;

determining, by a second-order loop of the circuit, a frequency offset of the interpolated clock signal based on the phase error;

determining, by a phase integrator of the circuit, a first phase position based on the frequency offset and the phase error correction;

mapping, by a look-up-table component of the circuit, the first phase position to a second phase position based on a look-up table;

combining, by an adder component of the circuit, the phase error correction and the second phase position to generate an adjusted phase position;

over a plurality of phase rotations of the phase interpolator, tracking, by a measurement component of the circuit, a plurality of phase errors for a corresponding plurality of phase positions based on the frequency offset, a last phase position of the interpolated clock signal, and the phase error;

updating, by the measurement component, the look-up table based on at least one tracked phase error of the plurality of phase errors; and generating, by the phase interpolator, the interpolated clock signal based on the adjusted phase position.

13. The method of claim 12, wherein the first phase position comprises a first phase code, wherein the second phase position comprises a second phase code, wherein the last phase position comprises a last phase code, wherein the adjusted phase position comprises an adjusted phase code.

14. The method of claim 12, wherein the measurement component comprises a plurality of accumulators that operate in parallel to track the plurality of phase errors for the corresponding plurality of phase positions simultaneously, over the plurality of phase rotations of the phase interpolator, based on the last phase position and the phase error.

15. The method of claim 14, wherein the measurement component comprises a microcontroller configured to control the plurality of accumulators.

16. The method of claim 12, comprising:

generating, by a delay component of the circuit, the last phase position based on the adjusted phase position.

17. The method of claim 12, wherein the look-up table comprises one or more phase position correction values corresponding to different phase positions.

18. The method of claim 17, wherein the look-up-table component maps the first phase position to the second phase position based on the look-up table by:

identifying, in the look-up table, a select correction value that corresponds to the first phase position; and applying the select correction value to the first phase position to generate the second phase position.

19. A non-transitory computer-readable medium comprising instructions that, when executed by a processor of a device, cause the device to perform operations comprising:

configuring, in a circuit design, a phase detector configured to receive an input data signal, receive an interpolated clock signal generated by a phase interpolator, and determine a phase error of the interpolated clock signal based on the input data signal and the interpolated clock signal;

configuring, in the circuit design, a first-order path configured to determine a phase error correction for the interpolated clock signal based on the phase error;

configuring, in the circuit design, a second-order loop configured to determine a frequency offset of the interpolated clock signal based on the phase error;

configuring, in the circuit design, a phase integrator configured to determine a first phase position based on the frequency offset and the phase error correction;

configuring, in the circuit design, a look-up-table component configured to map the first phase position to a second phase position based on a look-up table;

configuring, in the circuit design, an adder component configured to combine the phase error correction and the second phase position to generate an adjusted phase position;

configuring, in the circuit design, a measurement component configured to:

over a plurality of phase rotations of the phase interpolator, track a plurality of phase errors for a corresponding plurality of phase positions based on the frequency offset, a last phase position of the interpolated clock signal, and the phase error; and update the look-up table based on at least one tracked phase error of the plurality of phase errors; and configuring the phase interpolator in the circuit design, the phase interpolator being configured to generate the interpolated clock signal based on the adjusted phase position.

20. The non-transitory computer-readable medium of claim 19, wherein the operations comprise:

configuring, in the circuit design, a delay component configured to receive the adjusted phase position and generate the last phase position.

* * * * *